(12) United States Patent  
Tuncer et al.

(10) Patent No.: US 7,058,907 B2  
(45) Date of Patent: Jun. 6, 2006

(54) REDUCTION OF CROSS-TALK NOISE IN VLSI CIRCUITS

(75) Inventors: Emre Tuncer, Santa Cruz, CA (US); Hamid Savoj, Los Altos, CA (US); Premal Buch, Daly City, CA (US)

(73) Assignee: Magma Design Automation, Inc., Cupertino, CA (US)

( * ) Notice: Subject to any disclaimer, the term of this patent is extended or adjusted under 35 U.S.C. 154(b) by 154 days.

(21) Appl. No.: 10/776,402

(22) Filed: Feb. 10, 2004

(65) Prior Publication Data

US 2004/0205678 A1    Oct. 14, 2004

Related U.S. Application Data

(60) Provisional application No. 60/461,959, filed on Apr. 9, 2003.

(51) Int. Cl.
*G06F 17/50* (2006.01)

(52) U.S. Cl. .............................. 716/2; 716/6
(58) Field of Classification Search ............... 716/2, 716/6
See application file for complete search history.

(56) References Cited

U.S. PATENT DOCUMENTS

| | | | |
|---|---|---|---|
| 5,568,395 A * | 10/1996 | Huang ........................... | 716/4 |
| 5,596,506 A | 1/1997 | Petschauer et al. | |
| 5,983,006 A | 11/1999 | Carlson et al. | |
| 6,205,571 B1 | 3/2001 | Camporese et al. | |
| 6,334,205 B1 | 12/2001 | Iyer et al. | |
| 6,449,753 B1 * | 9/2002 | Aingaran et al. ............... | 716/5 |
| 2002/0133791 A1 * | 9/2002 | Cohn et al. .................... | 716/4 |

FOREIGN PATENT DOCUMENTS

EP    0891045 A1    1/1999

OTHER PUBLICATIONS

"Crosstalk complicates IP reuse" [online]. *EE Times*, Mar. 25, 2002 (Copyright CMP Media, LLC, 2003) [retrieved on Apr. 7, 2003]. Retrieved from the Internet: <URL: http://www.eedesign.com/printableArticle?doc_id=OEG200203022S0062>, 2 pages.

Green, Lynne, "Electrical thresholds for identifying crosstalk aggressors," *Electronics Engineer*, May 2000, 3 pages.

(Continued)

*Primary Examiner*—Stacy A. Whitmore  
(74) *Attorney, Agent, or Firm*—Fenwick & West LLP (57) ABSTRACT

A process for reducing cross-talk noise in a VLSI circuit is disclosed. The process identifies a victim net in an integrated circuit and calculates a change in ground capacitance for the victim net to identify a noise amplitude less than or equal to a maximum allowable noise height. The process selects from a library one cell or a grouping of cells having an input capacitance for the victim net closest to the change in ground capacitance. The selected cell or grouping of cells is coupled to the victim net so that its change in ground capacitance provides a noise amplitude less than (or less than or equal to) an allowable maximum noise height that may be a predetermined value. A system for reducing cross-talk noise in a VLSI circuit is also disclosed.

36 Claims, 3 Drawing Sheets

OTHER PUBLICATIONS

Maheshwary, Rajiv, "New Methodologies Needed to Tackle Crosstalk Problems" [online] [retrieved on Apr. 7, 2003]. Retrieved from the Internet: <URL: http://www.e-insite.net/ecnmag/index.asp?layout=articlePrint&articleID . . . >, 5 pages.

Young, Tak, "IC layout must avoid crosstalk problems" [online]. *EE Times*, Jun. 5, 2002 (Copyright: CMP Media, LLC, 2003) [retrieved on Apr. 7, 2003]. Retrieved from the Internet: <URL: http://www.eedesign.com/printableArticle?doc_id=OEG20020604S0045>, 4 pages.

Young, Tak, "Systems and Infrastructure: Foundation laid for crosstalk avoidance" [online]. *EE Times*, Apr. 17, 2001 (Copyright: CMP Media, LLC, 2003) [retrieved on Apr. 7, 2003]. Retrieved from the Internet: <URL: http://www.commsdesign.com/printableArticle?doc_id=OEG20010417S046>, 4 pages.

Cong, J. et al., "Improved Crosstalk Modeling For Noise Constrained Interconnect Optimization," Design Automation Conference, 2001, Proceedings Of The ASP-DAC 2001, Asia And South Pacific, Jan. 30-Feb. 2, 2001, pp. 373-378.

"Notification Of Transmittal Of The International Search Report And The Written Opinion Of The International Searching Authority, Or The Declaration," PCT/US2004/007971, Apr. 5, 2005, 15 pages.

\* cited by examiner

REDUCTION OF CROSS-TALK NOISE IN VLSI CIRCUITS

RELATED APPLICATIONS

This application claims a priority benefit of U.S. patent application Ser. No. 60/461,959, filed Apr. 9, 2003, the contents of which are herein incorporated by reference.

BACKGROUND OF THE INVENTION

1. Field of the Invention

The present invention relates to very large scale integration ("VLSI") circuits and, more particularly, to reducing cross-talk noise in VLSI circuits.

2. Description of the Related Arts

Conventionally, an integrated circuit chip is comprised of a thin, flat semiconductor substrate having a predefined shape (e.g., rectangular or square) and size (e.g., about 10 millimeters ("mm") to 25 mm on a side). Integrated into one surface of that substrate are a huge number of microscopic transistors. On top of those transistors are several patterned layers of conductive material and several patterned layers of insulating material that are fabricated in a stack. These insulating layers and conductive layers alternate such that an insulating layer separates any two conductive layers.

All of the conductive layers are patterned to form signal lines that interconnect the transistors, and they are also patterned to form DC voltage busses and ground busses by which power is supplied to the transistors. Some of the signal lines interconnect the transistors into multiple logic gates, for example logic AND gates, OR gates, NAND gates, and the like. The remaining signal lines interconnect the logic gates to each other so that they may perform some predetermined logic function.

With present day technology, the typical number of transistors on a single chip is rapidly approaching one billion. Moreover, the number of logic gates that are formed by the transistors is reaching one million, combinations of which are interconnected through appropriate signal lines. Each such interconnection from the output from one logic gate (the driver) to the input of one or more other logic gates (the receivers) is herein called a "net."

Ideally, the digital signals which are generated by a driver logic gate on one particular net will not affect the digital signals which are generated by any other driver logic gate on any other net. However, whenever two nets have signal line segments that lie next to each other, then a distributed parasitic capacitance will exist between them; and consequently, a voltage transition on one signal line. This is often referred to as an aggressor net and it will cause a certain amount of cross-talk noise (e.g., noise voltage) to be coupled into the other signal line, which is often referred to as a victim net.

As minimum feature size in circuits is shrinking, signal integrity issues gain importance due to increased coupling between nets in VLSI circuits. This coupling that may result in cross-talk noise (i.e, where the signal on one net (the victim net), is affected by the changes in the signal of its neighboring nets (the aggressor nets)) that can cause functional errors or increase power usage due to spurious switching on victim nets, even though false values are not latched at registers. Decreasing feature sizes affects the cross-talk noise problem in two ways. First, it increases coupling capacitance between nets. Second, smaller transistors cause faster slew rates.

Cross-talk noise depends on the amount of coupling capacitance between a victim net and its neighboring nets versus the victim net's capacitance to ground, aggressor net slew rates, and victim net resistance path to power or ground supply. As coupling capacitance to ground capacitance ratio increases, cross-talk noise increases. Similarly, as aggressor slew rates get faster, cross-talk noise increases. Decreasing victim resistance to power or ground supply will decrease cross-talk noise.

To resolve cross-talk glitch problems, currently different methods are used. Buffering victim nets decreases resistance along discharge path to reduce noise height as well as increasing pin capacitance, which adds capacitance to ground. But this may also make a victim an aggressor, making convergence difficult. Spacing wires apart decreases coupling capacitance, and in effect reduces noise height. However, the effectiveness of this technique is limited in congested designs where introducing extra spacing between wires is not possible.

Therefore, there is a need for a solution to reduce cross-talk noise in VLSI circuits, while limiting or avoiding disturbance of overall circuit design, while minimizing a number of wires touched and allowing or guaranteeing convergence.

SUMMARY OF THE INVENTION

The present invention includes a system and a technique to reduce cross-talk noise that comprises increasing the non-coupling capacitance as a percentage of the total capacitance. In one embodiment the present invention analyzes a circuit configuration to add extra pin capacitance to victim nets to decrease coupling capacitance to ground capacitance ratio. As an example, once cross-talk noise victim nets are identified, extra pin capacitance is added to these nets using a logic library cell, for example, an inverter. Alternatively, any other library element input pin or special capacitance cells may also be used.

It is noted that in one embodiment, the size of the cell or cells to be added is chosen to add sufficient capacitance to resolve the cross-talk noise problem on a particular net. For example, the extra pin capacitance can be added by connecting an input pin of the correct size inverter or capacitance cell to the victim net. The new cell may be coupled directly with the victim net or it may be placed close to the victim net and connected to the net using incremental routing.

The present invention includes a number of benefits. For example, the present invention beneficially does not disturb an overall solution for a circuit layout. In addition, the present invention advantageously touches a minimal number of wires, while guaranteeing convergence because new slews are always larger than previous slews.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The invention has other advantages and features which will be more readily apparent from the following detailed description of the invention and the appended claims, when taken in conjunction with the accompanying drawings, in which:

DETAILED DESCRIPTION OF THE INVENTION

The present invention includes a technique to reduce cross-talk noise that comprises increasing the non-coupling capacitance as a percentage of the total capacitance for a particular circuit design.

Figure 1:
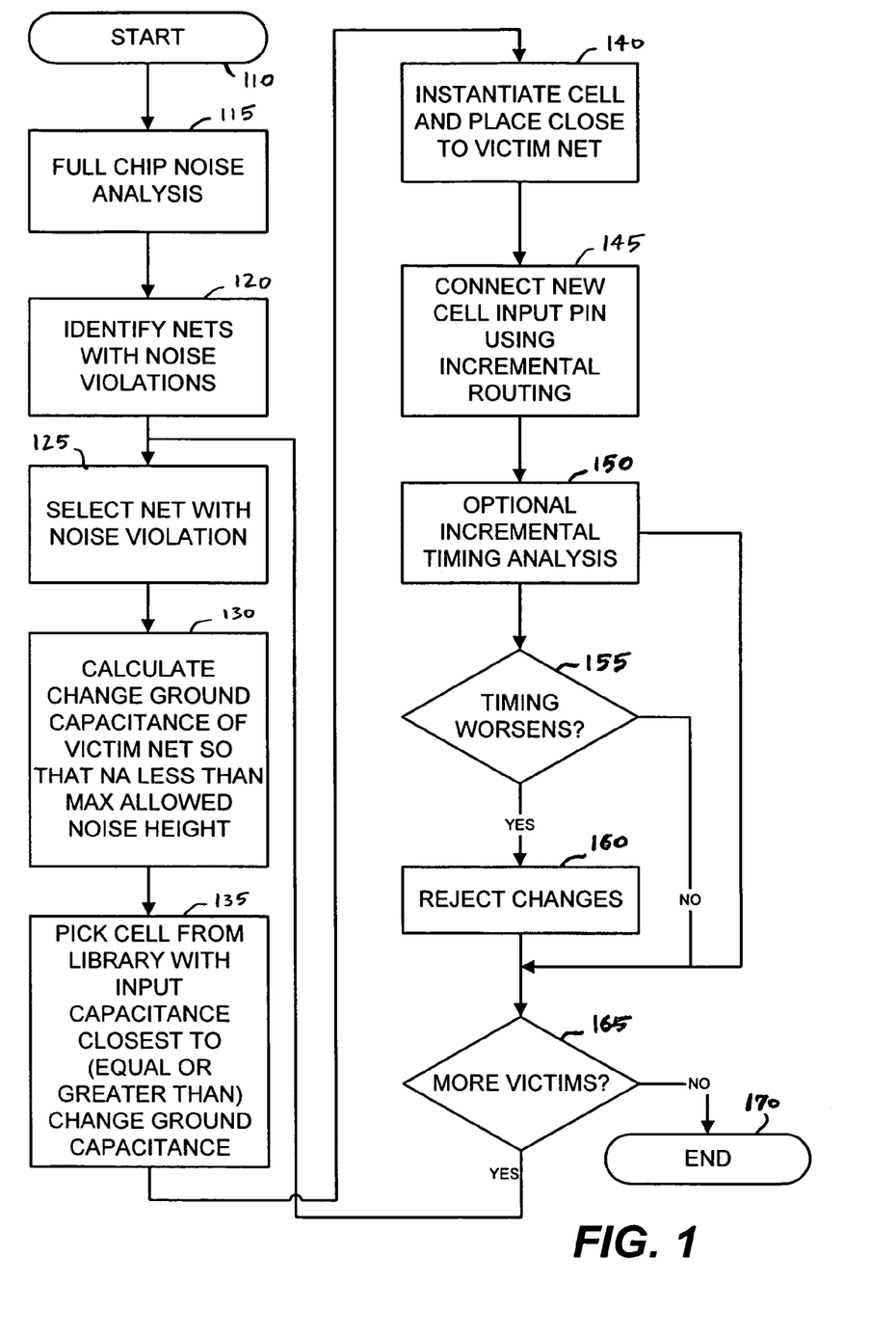
FIG. 1 illustrates a flow diagram of a process for reducing cross-talk noise between a victim net and one or more aggressor nets in accordance with one embodiment of the present invention.

FIG. 1 illustrates a flow diagram of a process for reducing cross-talk noise between a victim net and one or more aggressor nets in accordance with one embodiment of the present invention. It is noted that although the process is described with respect to a full chip analysis, the principles described herein may also work with a partial chip analysis, for example, by isolating a portion of the chip to be analyzed.

The process starts 110 with a full integrated circuit chip ("chip") analysis 115, which evaluates one or more chip performance characteristics, e.g., on chip noise or other measured voltage swings relating to noise characteristics, in view of the designed circuit layout. In one embodiment, the analysis provides a noise pulse height (or amplitude) for each net within the chip and the noise height may be stored in a database for reference against a predetermined noise margin (e.g., a maximum allowable noise height) for the chip as a whole, a portion of the chip, or the particular net. Further, in one embodiment the noise margin may be an amplitude value that is a predetermined percentage of the supply voltage value.

Next, the process identifies 120 those nets on the chip (or subset thereof) that have noise violations. Any of the one or more nets on the chip having noise violation would be the victim nets and neighboring nets around a victim net that cause or contribute to the noise violation of that victim net would be an aggressor net. Noise violations include noise pulses for a net that are above (or greater than) the predetermined noise margin.

The process selects 125 a victim net that has a noise violation for further analysis to determine a capacitance to add to reduce the noise on that victim net. For this, the process calculates 130 a change in ground capacitance of the victim net ($\Delta C_g$) so that a noise amplitude ($N_A$) for the victim net is less than the maximum allowed noise height (or noise margin). In one embodiment, the analysis is carried out using equation:

$$N_A \cong (R_d C_c)/(R_d(C_g+C_c)+(\text{Slew}_{agg}/2)),$$

where $N_A$ is a noise amplitude, $R_d$ is a holding resistance of a victim net's driver, $C_c$ is a coupling capacitance between a victim net and an aggressor net, $C_g$ is a ground capacitance of a victim net, and $\text{Slew}_{agg}$ is a slew of an aggressor net. From reviewing the above, it would be apparent to one of skill in the art, that increasing $C_g$ will reduce the noise amplitude, $N_A$.

Once the change in ground capacitance is calculated, the process selects 135 from a library a cell having an input capacitance closest to (e.g., equal or just greater than or equal and just less than) the change in ground capacitance ($\Delta C_g$). In an alternative embodiment, if the largest input pin capacitance is unable to resolve the noise on the victim net, the process could add different sizes of library cells such that a total input pin capacitance of chosen library cells is equal to or greater than the required increase in ground capacitance and minimum number of library cells is used.

It is noted that a cell library includes a set of well-characterized logic blocks in an electronic design automation system. Further, it is noted that the cell may be a conventional logic element, for example, an inverter, or it may be a conventional capacitance cell from a cell library and that functions to provide circuit capacitance.

The process instantiates 140 the cell and places it close to the victim net in the circuit by connecting 145 the new cell input pin using conventional incremental routing techniques. It is noted that in one embodiment, placement of the cell is close to an input pin present on the victim net where a noise violation was worst, e.g., where the noise pulse height was highest or where the difference between the measured noise pulse height and the maximum allowable noise height (or noise margin) was greatest. Alternatively, the cell may be placed at any other location along the net such that the noise pulse height would drop below the allowable noise height (or noise margin) without affecting neighboring nets.

Once the cell is placed in the victim net, the process may conduct an optional incremental timing analysis 150 to evaluate timing between inputs and outputs, as well as between sequential elements on the chip. If the process determines 155 that the timing became worse, the changes will be rejected 160. If the process determines 155 that the timing has not become worse, the process will allow for acceptance of the changes. The process then determines 165 if there are more victim nets. If there are more victim nets, the process begins again by selecting 125 another victim net with a noise violation and working through the process as described above.

It is noted that the optional incremental timing analysis 150 could also include other optional tests separate from or in conjunction with this step. For example, the process may also analyze portions of the chip or a net for changes in slew and for total capacitance value on the net to determine if they are within predetermined allowable values in relation to the chip, portion of the chip, and/or the net. In addition, where appropriate, other chip characteristics may also be tested in view of the addition of the cell to the victim net, for example, electromigration and power consumption.

It is also noted that in one embodiment the process (or system) may be configured to set predetermined values (or parameters) for the particular test to be performed. Moreover, the process (or system) may also be configured such that a test value below or above the predetermined value for the particular test to be performed can be determinative of an adverse affect on the integrated circuit (or portion thereof).

Figure 2A:
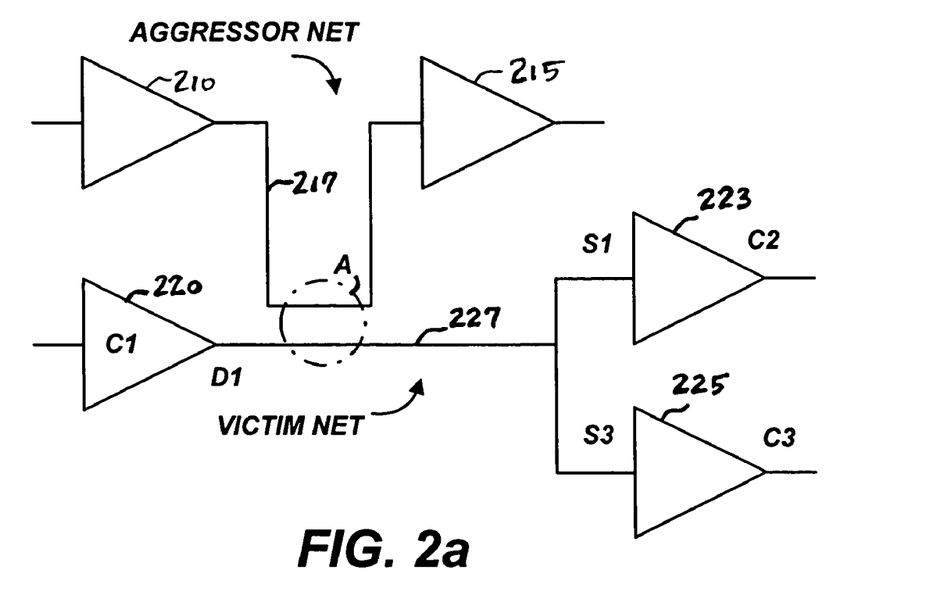
FIGS. 2a and 2b illustrate an example of a circuit having a capacitance net to reduce cross-talk noise in accordance with one embodiment of the present invention.
Figure 2B:
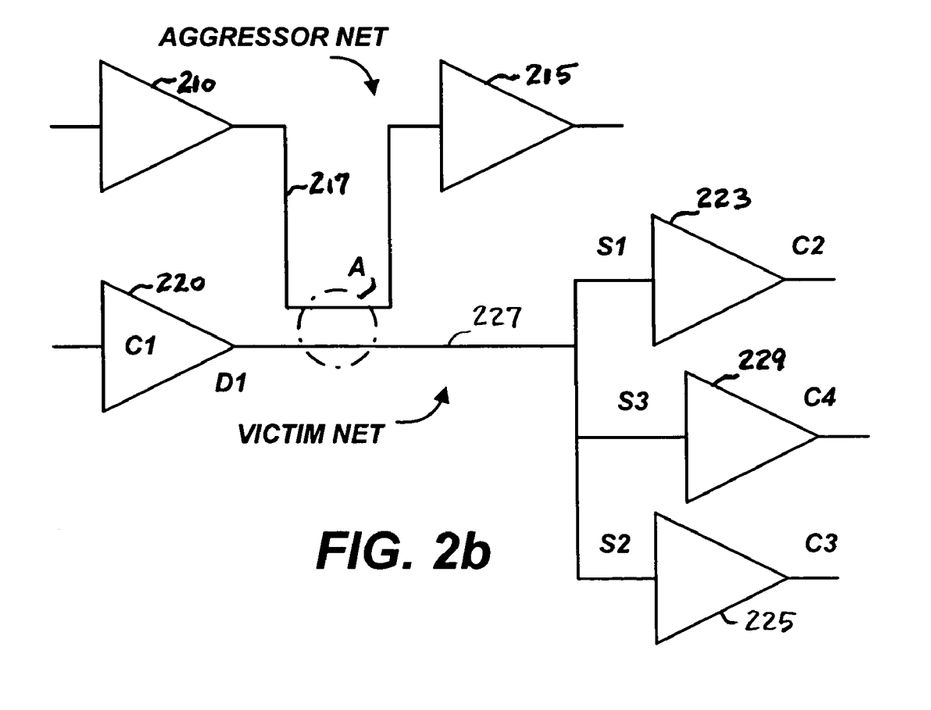

FIGS. 2a and 2b illustrate an example of a circuit having a capacitance net to reduce cross-talk noise in accordance with one embodiment of the present invention. FIG. 2a illustrates an initial circuit having an aggressor net that may include a first logic element 210 (e.g., a logic device, for example, an AND, OR, XOR, etc., or groupings thereof) and a second logic element 215 that are coupled through a coupling 217. The initial circuit illustrated also includes a victim net having a first logic element 220, a second logic element 223, and a third logic element 225, each coupled through coupling 227. In one embodiment, the couplings 217, 227 may be conventional wire couplings.

In this example, the layout of the circuit and the close coupling at a point A causes the noise pulse height of the victim net to be above a predetermined maximum allowable noise height for the circuit. Hence, using the process described herein and now shown in FIG. 2, a cell 229 with a large input capacitance, e.g., C4, and coupled to the initial circuit so that the input pin, e.g., S3, of C4 couples an output pin of the first input element of the victim net, e.g., C1. This increases ground capacitance of the entire victim net so that the noise amplitude for the victim net is less than the maximum allowable noise height (or noise margin).

As a more particular example, consider $C_g$ to be the total capacitance to ground, including the pin capacitances of pins S1, S2. In addition, consider the allowable noise amplitude on the victim net to be $N_m$ (noise margin of the net). Then the noise slack ($N_s$) is given by the equation ($N_m - N_A$), so that for negative values of noise slack the net is said to be violating noise requirements. Further, an expression for $\Delta C_g$ can be obtained using the equation which yield to:

$$\Delta C_g = (-C_c * N_s)/(N_m * N_A)$$

From here, C4 may be chosen from the library as a cell that has at least $\Delta C_g$ or more input pin capacitance. It is also noted that in alternative embodiments, two or more cells from the library may be selected to achieve a capacitance value that is equivalent to a value for C4.

The present invention beneficially provides for a number of advantages and benefits. For example, the present invention does not disturb an overall solution for a circuit layout because it allows for reducing cross-talk noise between a victim net and one or more aggressor nets without adversely affecting other chip and/or net characteristics such as timings, slew, or overall capacitance.

In addition, the present invention advantageously touches a minimal number of wires, while guaranteeing convergence because new slews are always larger than previous slews. It is also noted that adding capacitance to a net without changing its driver size will increase slew on the net. In the case where this victim aggressing on another net, noise amplitude on the other net will also reduce. From reviewing the equation for $N_A$, it would be apparent to one of skill in the art, increasing $Slew_{agg}$ will reduce the noise amplitude, $N_A$ on the other net.

Figure 3:
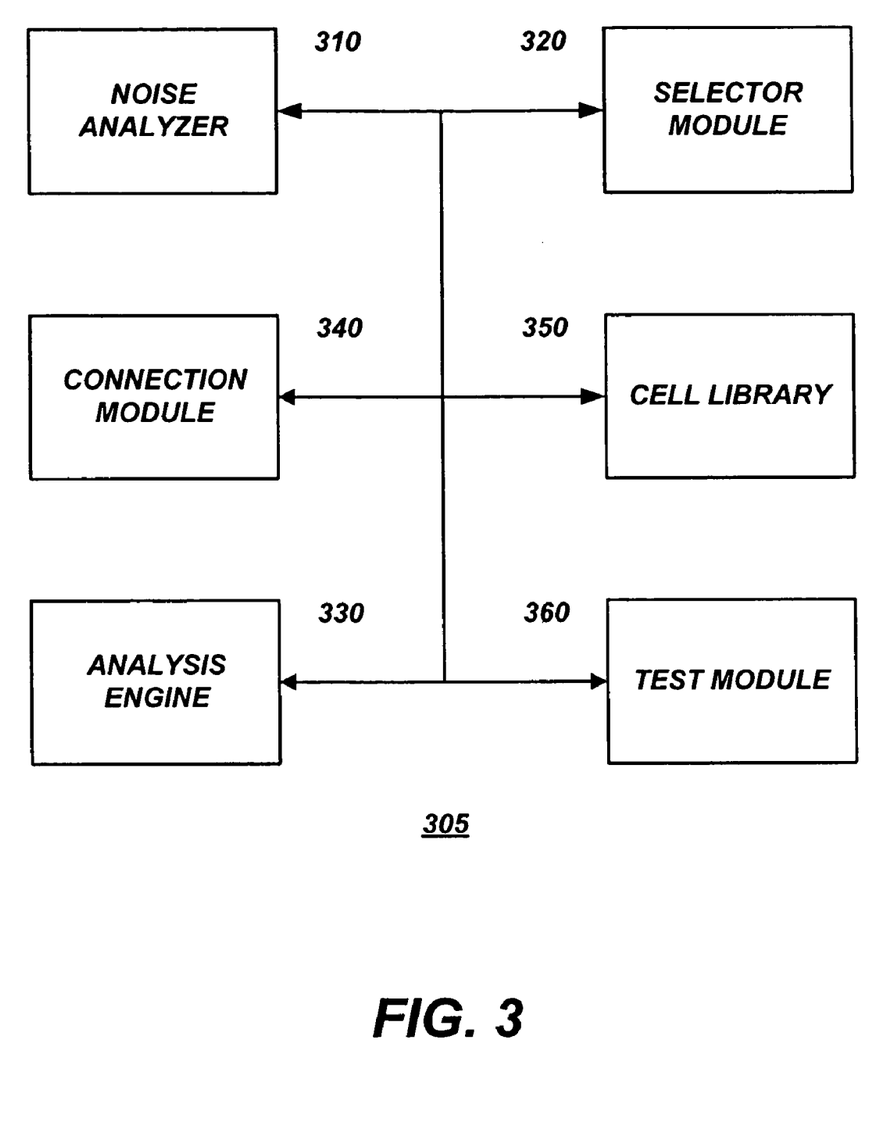
FIG. 3 illustrates a system for reducing cross-talk noise in accordance with one embodiment of the present invention.

It is noted that the present invention may be implemented in computer software, hardware, firmware, or a combination thereof. For example, the technique described herein may be embodied in modular functional components. FIG. 3 illustrates an example system 305 for reducing cross-talk noise in accordance with one embodiment of the present invention. The system 305 includes a noise analyzer 310, a selector module 320, an analysis engine 330, a connection module 340, a cell library 350, and a test module 360. Each part of the system 305 may be configured to communicatively couple with each other.

The noise analyzer 310 is configured to perform chip noise analysis. For example, the noise analyzer 310 may be configured to test each net in the chip design and determine the noise level for each net. The selector module 320 is configured to identify and select those nets from the chip analysis that have noise violations. For example, the selector module 320 may be configured to include an allowable max noise height (or a threshold noise value) parameter that is used to identify and select nets with noise violations.

The analysis engine 330 is configured to perform analyses on each net. For example, the analysis engine 330 may be configured to perform a capacitance evaluation by calculating a change of $C_g$ ($\Delta C_g$) so that $N_A$ is less than an allowable max noise height allowed (or threshold noise value) for each net. It is noted that the allowable maximum noise height value may be stored with the analysis engine 330 or could be stored elsewhere, e.g., the selector module 320. The analysis engine 330 may also be configured to perform other circuit analysis, for example, circuit timing analysis.

The cell library 350 is configured to store cells that may be placed (or connected) in the nets. For a particular net analyzed by the analysis engine 330, the connection module 340 is configured to select an appropriate cell (or group of cells) from the cell library 350 for that net based on the analysis engine 350 calculation of what $\Delta C_g$ should be to be less than (or equal to, depending on configuration and behavior sought for the net) $N_A$. The connection module 340 places (or connects) the selected cell (or group of cells) with that net using incremental routing. The test module 360 can then test the net with the added cell (or group of cells) to see if the noise level for the net is below the maximum allowed height. It is noted that in alternative embodiments the functionality of one or more components of the system 305 may be combined or collapsed into each other.

Upon reading this disclosure, those of skill in the art will appreciate still additional alternative structural and functional designs for a technique for reducing cross-talk noise between a victim net and one or more aggressor nets, in accordance with the disclosed principles of the present invention. Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A process for reducing cross-talk noise in a circuit, comprising:
   identifying a victim net in an integrated circuit;
   determining a change in ground capacitance for the victim net to identify a noise amplitude less than or equal to a maximum allowable noise height;
   calculating an input capacitance to add to the victim net in response to the determined change in the ground capacitance;
   selecting from a library at least one cell having a capacitance for the victim net closest to the calculated input capacitance; and
   coupling the at least one cell with the victim net.

2. The process of claim 1, wherein the at least one cell couples with the victim net using incremental routing.

3. The process of claim 1, wherein a value for the noise amplitude is determined through a calculation comprising:

$$(R_d C_c)/(R_d(C_g + C_c) + (Slew_{agg}/2)),$$

wherein $R_d$ comprises a holding resistance of a driver of the victim net, $C_c$ comprises a coupling capacitance between the victim net and an aggressor net, $C_g$ comprises a ground capacitance of the victim net, and $Slew_{agg}$ comprises a slew of the aggressor net.

4. The process of claim 1, wherein determining the change in ground capacitance further a calculation comprising:

$$(-C_c * N_s)/(N_m * N_A),$$

wherein, $C_c$ comprises a coupling capacitance, $N_s$ comprises a noise slack, $N_m$ comprises a noise margin, and $N_A$ comprises the noise amplitude.

5. The process of claim 4, wherein the noise slack comprises a difference between noise margin and noise amplitude.

6. The process of claim 1, further comprising testing an integrated circuit in response to connecting the at least one cell with the victim net.

7. The process of claim 6, wherein testing the integrated circuit further comprises one from a group consisting of conducing a timing analysis, conducting a change in slew analysis, conducting a power consumption analysis, and conducting an electromigration analysis.

8. The process of claim 6, further comprising rejecting the coupling of the at least one cell with the victim net in response to a result of the testing providing a value corresponding to an adverse effect on the integrated circuit.

9. A system for reducing cross-talk noise in a circuit, comprising:
a noise analyzer configured to identify a victim net in an integrated circuit;
an analysis engine configured to determine a value for a change in ground capacitance for a victim net, the change in ground capacitance providing a noise amplitude for the victim net less than or equal to a maximum allowed noise height, and to calculate an input capacitance to add to the victim net in response to the determined change in the ground capacitance; and
a library configured to provide at least one cell having an input capacitance for coupling with the victim net, a total input capacitance for the victim net having a value substantially close to the calculated input capacitance.

10. The system of claim 9, wherein the noise analyzer is further configured to determine the value of the change in ground capacitance through a calculation comprising:

$$(-C_c * N_s)/(N_m * N_A),$$

wherein, $C_c$ comprises a coupling capacitance, $N_s$ comprises a noise slack, $N_m$ comprises a noise margin, and $N_A$ comprises the noise amplitude.

11. The system of claim 10, wherein the noise slack comprises a difference between noise margin and noise amplitude.

12. The system of claim 9, wherein a value for the noise amplitude is determined through a calculation comprising:

$$(R_d C_c)/(R_d(C_g+C_c)+(Slew_{agg}/2)),$$

wherein $R_d$ comprises a holding resistance of a driver of the victim net, $C_c$ comprises a coupling capacitance between the victim net and an aggressor net, $C_g$ comprises a ground capacitance of the victim net, and $Slew_{agg}$ comprises a slew of the aggressor net.

13. The system of claim 9, further comprising a connection module configured to couple the at least one cell to the victim net.

14. The system of claim 13, further comprising a test module configured to test an integrated circuit incorporating the victim net in response to the coupling of the at least one cell to the victim net.

15. The system of claim 14, wherein the test comprises at least one test of a group consisting of a timing test, a slew test, power consumption test, and an electromigration test.

16. The system of claim 14, wherein the test module is further configured to reject coupling of the cell to the victim net in response to a result of the test providing a value corresponding to an adverse effect on the integrated circuit.

17. A system for reducing cross-talk noise in a very large scale integration ("VLSI") circuit, the system comprising:
a means for performing a noise analysis on a plurality of nets in the VLSI circuit;
a means for identifying at least one victim net among the plurality of nets, the victim net having a noise amplitude greater than a maximum allowable noise height;
a means for selecting a victim net from the at least one victim net;
a means for determining a change in a ground capacitance for the victim net such that the noise amplitude of the victim net is less than the maximum allowable noise height;
a means for calculating an input capacitance to add to the victim net in response to the determined change in ground capacitance;
a means for selecting from a cell library a cell providing an input capacitance value substantially close to the calculated input capacitance; and
a means for coupling the cell with the victim net.

18. The system of claim 17, further comprising a means for testing the VLSI circuit in response to coupling the cell with the victim net.

19. The system of claim 18, wherein the means for testing the VLSI circuit rejects coupling the cell with the victim net in response to a test value associated with an adverse affect on the VLSI circuit.

20. The system of claim 19, wherein the means for testing the VLSI circuit includes a process for conducting a circuit timing test and the test value associated with the adverse affect on the VLSI circuit comprises a value less than a predetermined timing value.

21. The system of claim 19, wherein the means for testing the VLSI circuit includes a process for conducting a power consumption test and the test value associated with the adverse affect on the VLSI circuit comprises a value less than a predetermined power consumption value.

22. The system of claim 17, wherein the cell comprises one from a group consisting of an inverter logic element and a capacitance cell.

23. A process for reducing cross-talk noise in a very large scale integration ("VLSI") circuit, the process comprising:
performing a noise analysis on a plurality of nets in the VLSI circuit;
identifying at least one victim net among the plurality of nets, the victim net having a noise amplitude greater than a maximum allowable noise height;
selecting a victim net from the at least one victim net;
determining a change in a ground capacitance for the victim net such that the noise amplitude of the victim net is less than the maximum allowable noise height;
calculating an input capacitance to add to the victim net in response to the determined change in ground capacitance;
selecting from a cell library a cell providing an input capacitance value substantially close to the calculated input capacitance; and
coupling the cell with the victim net.

24. The process of claim 23, further comprising testing the VLSI circuit in response to the coupling of the cell with the victim net.

25. The process of claim 24, wherein the step of testing the VLSI circuit further comprises rejecting the coupling of the cell with the victim net in response to a test value associated with an adverse affect on the VLSI circuit.

26. The process of claim 25, wherein the step of testing the VLSI circuit comprises performing a timing test and the test value associated with the adverse affect on the VLSI circuit comprises a value less than a predetermined timing value.

27. The process of claim 25, wherein the step of testing the VLSI circuit comprises performing a power consumption test and the test value associated with the adverse affect on the VLSI circuit comprises a value less than a predetermined power consumption value.

28. The system of claim 23, wherein the cell comprises one from a group consisting of an inverter logic element and a capacitance cell.

29. A process for reducing cross-talk noise in a circuit, comprising:
identifying a victim net in an integrated circuit;
determining a change in ground capacitance for the victim net to identify a noise amplitude less than or equal to a maximum allowable noise height;
selecting from a library at least one cell having an input capacitance for the victim net closest to the change in ground capacitance; and
coupling the at least one cell with the victim net,
wherein a value for the noise amplitude is determined through a calculation comprising:

$(R_d C_c)/(R_d(C_g+C_c)+(Slew_{agg}/2))$, wherein $R_d$ comprises a holding resistance of a driver of the victim net, $C_c$ comprises a coupling capacitance between the victim net and an aggressor net, $C_g$ comprises a ground capacitance of the victim net, and $Slew_{agg}$ comprises a slew of the aggressor net.

30. The process of claim 29, wherein the at least one cell couples with the victim net using incremental routing.

31. A process for reducing cross-talk noise in a circuit, comprising:
identifying a victim net in an integrated circuit;
determining a change in ground capacitance for the victim net to identify a noise amplitude less than or equal to a maximum allowable noise height;
selecting from a library at least one cell having an input capacitance for the victim net closest to the change in ground capacitance; and
coupling the at least one cell with the victim net,
wherein determining the change in ground capacitance further a calculation comprising:

$(-C_c*N_s)/(N_m*N_A)$, wherein, $C_c$ comprises a coupling capacitance, $N_s$ comprises a noise slack, $N_m$ comprises a noise margin, and $N_A$ comprises the noise amplitude.

32. The process of claim 31, wherein the at least one cell couples with the victim net using incremental routing.

33. A system for reducing cross-talk noise in a circuit, comprising:
a noise analyzer configured to identify a victim net in an integrated circuit;
an analysis engine configured to determine a value for a change in ground capacitance for a victim net, the change in ground capacitance providing a noise amplitude for the victim net less than or equal to a maximum allowed noise height; and
a library configured to provide at least one cell having an input capacitance for coupling with the victim net, a total input capacitance for the victim net having a value substantially close to the change in ground capacitance,
wherein the noise analyzer is further configured to determine the value of the change in ground capacitance through a calculation comprising:

$(-C_c*N_s)/(N_m*N_A)$, wherein, $C_c$ comprises a coupling capacitance, $N_s$ comprises a noise slack, $N_m$ comprises a noise margin, and $N_A$ comprises the noise amplitude.

34. The system of claim 33, wherein the noise slack comprises a difference between noise margin and noise amplitude.

35. A system for reducing cross-talk noise in a circuit, comprising:
a noise analyzer configured to identify a victim net in an integrated circuit;
an analysis engine configured to determine a value for a change in ground capacitance for a victim net, the change in ground capacitance providing a noise amplitude for the victim net less than or equal to a maximum allowed noise height; and
a library configured to provide at least one cell having an input capacitance for coupling with the victim net, a total input capacitance for the victim net having a value substantially close to the change in ground capacitance,
wherein a value for the noise amplitude is determined through a calculation comprising:

$(R_d C_c)/(R_d(C_g+C_c)+(Slew_{agg}/2))$, wherein $R_d$ comprises a holding resistance of a driver of the victim net, $C_c$ comprises a coupling capacitance between the victim net and an aggressor net, $C_g$ comprises a ground capacitance of the victim net, and $Slew_{agg}$ comprises a slew of the aggressor net.

36. The system of claim 35, further comprising a connection module configured to couple the at least one cell to the victim net.

* * * * *

UNITED STATES PATENT AND TRADEMARK OFFICE
CERTIFICATE OF CORRECTION

PATENT NO. : 7,058,907 B2
APPLICATION NO. : 10/776402
DATED : June 6, 2006
INVENTOR(S) : Emre Tuncer It is certified that error appears in the above-identified patent and that said Letters Patent is hereby corrected as shown below:

In Column 7, Line 16, delete "conducing" and insert -- conducting --

Signed and Sealed this

First Day of August, 2006

JON W. DUDAS
*Director of the United States Patent and Trademark Office*